United States Patent
Abrishamkar et al.

(10) Patent No.: US 7,042,928 B2
(45) Date of Patent: May 9, 2006

(54) METHOD AND APPARATUS FOR PILOT ESTIMATION USING PREDICTION ERROR METHOD

(75) Inventors: Farrokh Abrishamkar, San Diego, CA (US); Kenneth Kreutz-Delgado, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 463 days.

(21) Appl. No.: 10/279,535

(22) Filed: Oct. 23, 2002

(65) Prior Publication Data

US 2004/0081230 A1    Apr. 29, 2004

(51) Int. Cl.
H04B 15/00  (2006.01)
H04K 1/00  (2006.01)
H04L 27/30  (2006.01)

(52) U.S. Cl. .................. 375/147; 370/335; 370/342; 370/441

(58) Field of Classification Search ................ 375/130, 375/140, 142, 143, 147, 150, 152, 346, 350, 375/144, 148, 224, 285, 341; 370/335, 342, 370/441, 491, 500, 241, 479
See application file for complete search history.

(56) References Cited

U.S. PATENT DOCUMENTS

| | | | |
|---|---|---|---|
| 4,839,843 A * | 6/1989 | Veldhuis ...................... 708/314 |
| 4,901,307 A | 2/1990 | Gilhousen et al. |
| 5,101,501 A | 3/1992 | Gilhousen et al. |
| 5,103,459 A | 4/1992 | Gilhousen et al. |
| 5,224,061 A * | 6/1993 | Veldhuis ...................... 708/300 |
| 5,414,734 A * | 5/1995 | Marchetto et al. .......... 375/267 |
| 5,432,816 A * | 7/1995 | Gozzo ......................... 375/232 |
| 5,640,429 A * | 6/1997 | Michels et al. .............. 375/340 |
| 5,764,687 A | 6/1998 | Easton |
| 5,822,380 A * | 10/1998 | Bottomley ................... 375/347 |
| 6,240,099 B1 * | 5/2001 | Lim et al. .................... 370/441 |

(Continued)

FOREIGN PATENT DOCUMENTS

WO    00/67389    11/2000

OTHER PUBLICATIONS

C. Bohn et al., "Sensitivity models for nonlinear filters with application to recursive parameter estimation for nonlinear state-space models," IEE Proceedings D. Control Theory & Applications, Institution of Electrical Engineers, Stevenag, GB, vol. 148, No. 2, Mar. 21, 2001, pp. 137-145.

(Continued)

*Primary Examiner*—Jean B Corrielus
(74) *Attorney, Agent, or Firm*—Philip Wadsworth; Charles D. Brown; Nicholas J. Pauley

(57) ABSTRACT

A system is disclosed for use in a wireless communication system to provide an estimated pilot signal. The system includes a receiver and a front-end processing and despreading component in electronic communication with the receiver for despreading a CDMA signal. A pilot estimation component is in electronic communication with the front-end processing and despreading component for estimating an original pilot signal using a pilot estimator that includes a Kalman filter to produce a pilot estimate. The Kalman filter is determined through use of a prediction error method based on an innovations representation of the original pilot signal. A demodulation component is in electronic communication with the pilot estimation component and the front-end processing and despreading component for providing demodulated data symbols.

27 Claims, 11 Drawing Sheets

U.S. PATENT DOCUMENTS

| | | | |
|---|---|---|---|
| 6,295,289 B1 * | 9/2001 | Ionescu et al. | 370/342 |
| 6,363,104 B1 * | 3/2002 | Bottomley | 375/148 |
| 6,411,649 B1 * | 6/2002 | Arslan et al. | 375/232 |
| 6,456,647 B1 * | 9/2002 | Banister | 375/142 |
| 6,493,329 B1 * | 12/2002 | Leung | 370/335 |
| 6,580,772 B1 * | 6/2003 | Pajukoski | 375/350 |
| 6,680,969 B1 * | 1/2004 | Molnar et al. | 375/224 |
| 2002/0051485 A1 * | 5/2002 | Bottomley | 375/147 |

OTHER PUBLICATIONS

K.S. Shanmugan et al., "Channel Estimation for 3G Wideband CDMA Systems using the Kalman Filtering Algorithm," IEEE International Conference on Personal Wireless Communications Proceedings, Dec. 17, 2000, pp. 95-97.

X. Zhou et al., "Kalman Filter Channel Tracking Algorithm Based on AR Model in WCDMA Systems," WCC 2000—ICSP 2000. 2000 5th International Conference on Signal Processing Proceedings. 16th World Computer Congress 2000, Proceedings of 5th International Conference on Signal Processing, Beijing, China; Aug. 21-25, 2000, vol. 3, pp. 1759-1762.

* cited by examiner

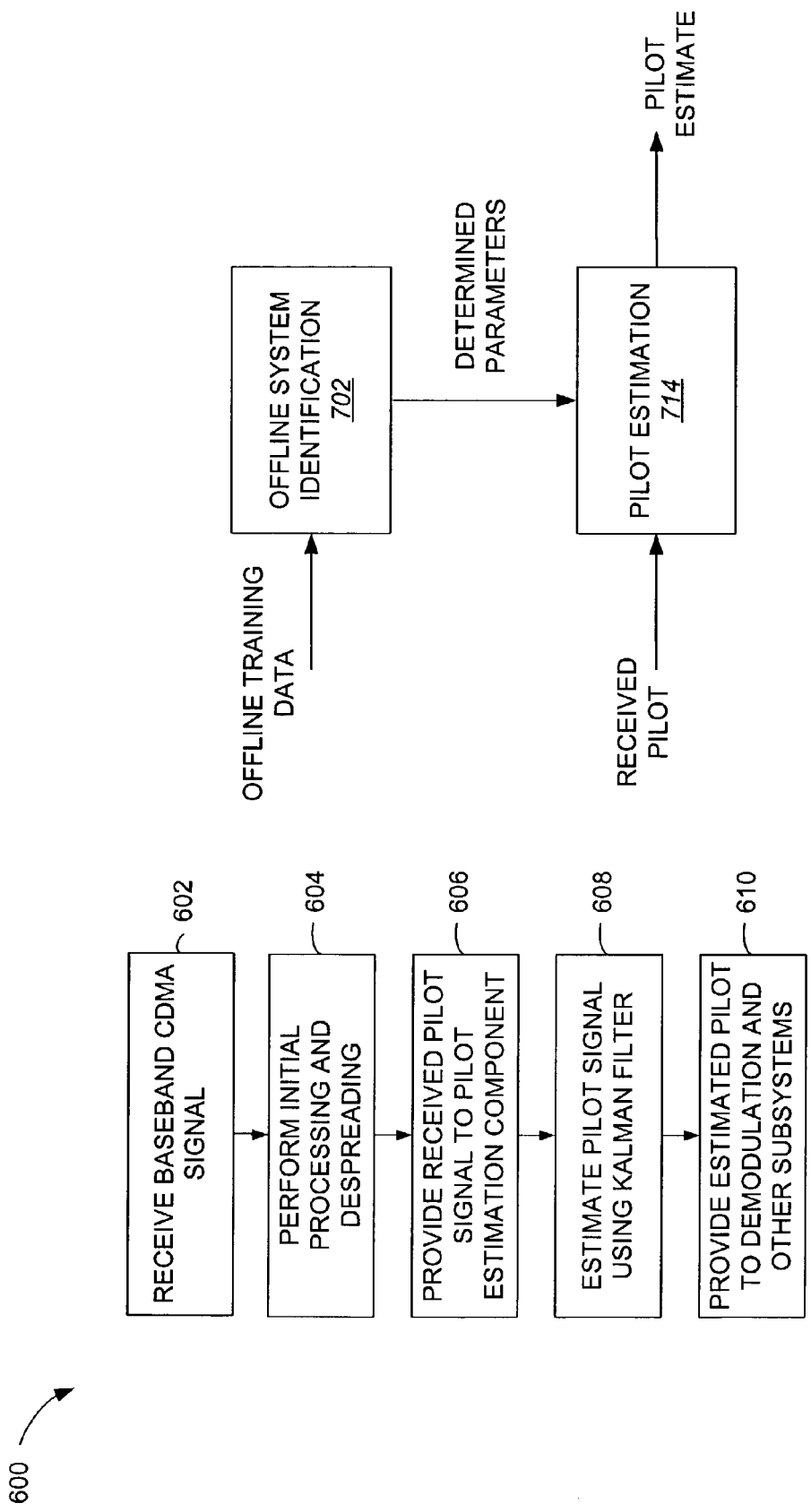

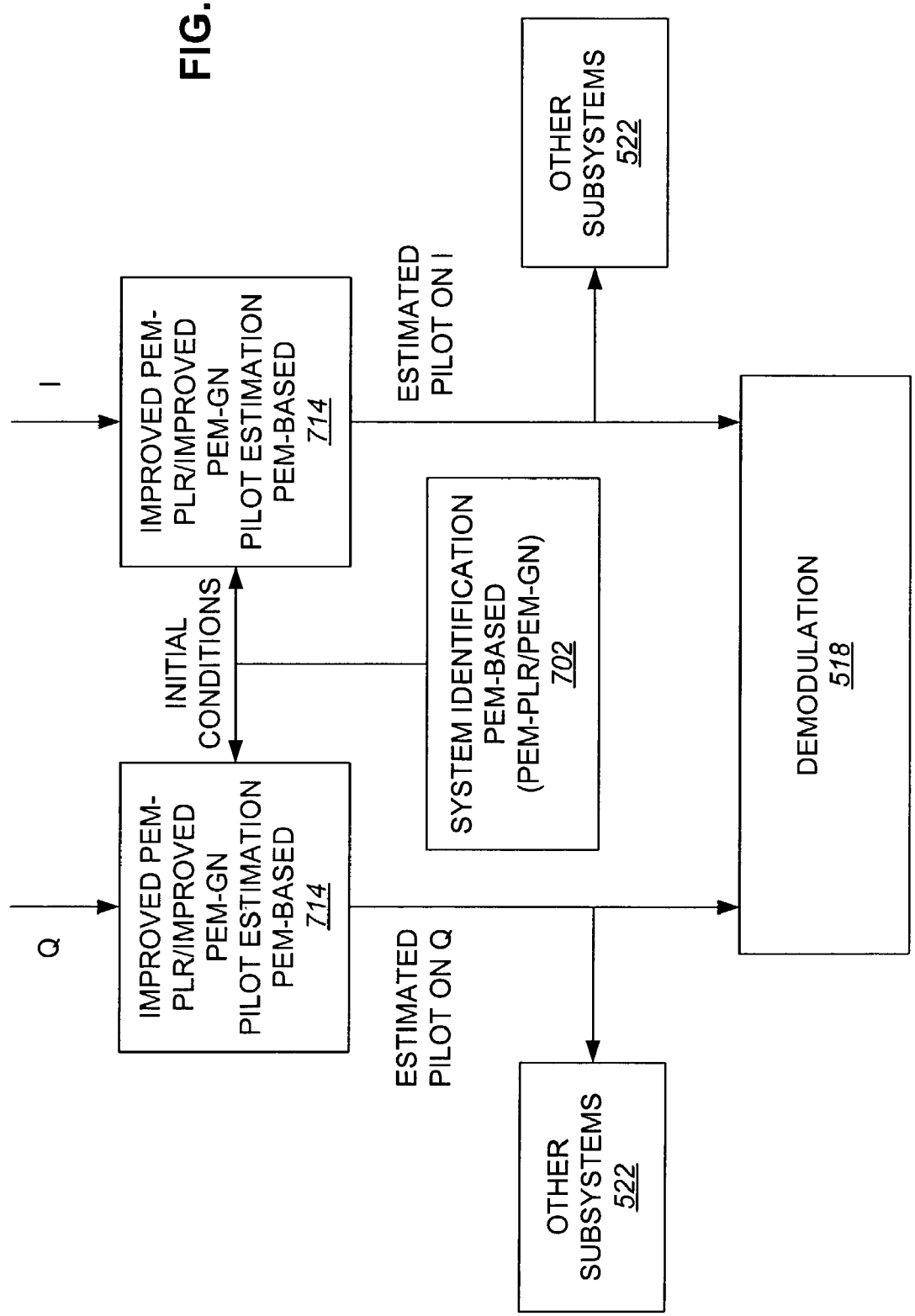

METHOD AND APPARATUS FOR PILOT ESTIMATION USING PREDICTION ERROR METHOD

RELATED APPLICATIONS

Reference to Co-Pending Applications for Patent

The present invention is related to the following Applications for Patent in the U.S. Patent & Trademark Office: "Method And Apparatus For Pilot Estimation Using Suboptimum Expectation Maximization" by Farrokh Abrishamkar et al., U.S. application Ser. No. 10/262,306, filed on Sep. 30, 2002, and assigned to Qualcomm, Inc.

FIELD

The present invention relates to wireless communication systems generally and specifically, to methods and apparatus for estimating a pilot signal in a code division multiple access system.

BACKGROUND

In a wireless radiotelephone communication system, many users communicate over a wireless channel. The use of code division multiple access (CDMA) modulation techniques is one of several techniques for facilitating communications in which a large number of system users are present. Other multiple access communication system techniques, such as time division multiple access (TDMA) and frequency division multiple access (FDMA) are known in the art. However, the spread spectrum modulation technique of CDMA has significant advantages over these modulation techniques for multiple access communication systems.

The CDMA technique has many advantages. An exemplary CDMA system is described in U.S. Pat. No. 4,901,307, entitled "Spread Spectrum Multiple Access Communication System Using Satellite Or Terrestrial Repeaters", issued Feb. 13, 1990, assigned to the assignee of the present invention, and incorporated herein by reference. An exemplary CDMA system is further described in U.S. Pat. No. 5,103,459, entitled "System And Method For Generating Signal Waveforms In A CDMA Cellular Telephone System", issued Apr. 7, 1992, assigned to the assignee of the present invention, and incorporated herein by reference.

In each of the above patents, the use of a forward-link (base station to mobile station) pilot signal is disclosed. In a typical CDMA wireless communication system, such as that described in EIA/TIA IS-95, the pilot signal is a "beacon" transmitting a constant data value and spread with the same pseudonoise (PN) sequences used by the traffic bearing signals. The pilot signal is typically covered with the all-zero Walsh sequence. During initial system acquisition, the mobile station searches through PN offsets to locate a base station's pilot signal. Once it has acquired the pilot signal, it can then derive a stable phase and magnitude reference for coherent demodulation, such as that described in U.S. Pat. No. 5,764,687 entitled "Mobile Demodulator Architecture For A Spread Spectrum Multiple Access Communication System," issued Jun. 9, 1998, assigned to the assignee of the present invention, and incorporated herein by reference.

Recently, third-generation (3G) wireless radiotelephone communication systems have been proposed in which a reverse-link (mobile station to base station) pilot channel is used. For example, in the currently proposed cdma2000 standard, the mobile station transmits a Reverse Link Pilot Channel (R-PICH) that the base station uses for initial acquisition, time tracking, rake-receiver coherent reference recovery, and power control measurements.

Pilot signals can be affected by noise, fading and other factors. As a result, a received pilot signal may be degraded and different than the originally transmitted pilot signal. Information contained in the pilot signal may be lost because of noise, fading and other factors.

There is a need, therefore, to process the pilot signal to counter the effects of noise, fading and other signal-degrading factors.

BRIEF DESCRIPTION OF THE DRAWINGS

FIG. 6 is a flow diagram of one embodiment of a method for estimating the pilot using a Kalman filter.

FIG. 7 is a block diagram illustrating the use of an offline system identification component to determine the parameters needed by the Kalman filter.

FIG. 14 is a block diagram of pilot estimation where the filtering is broken down into its I and Q components.

DETAILED DESCRIPTION

Figure 1:
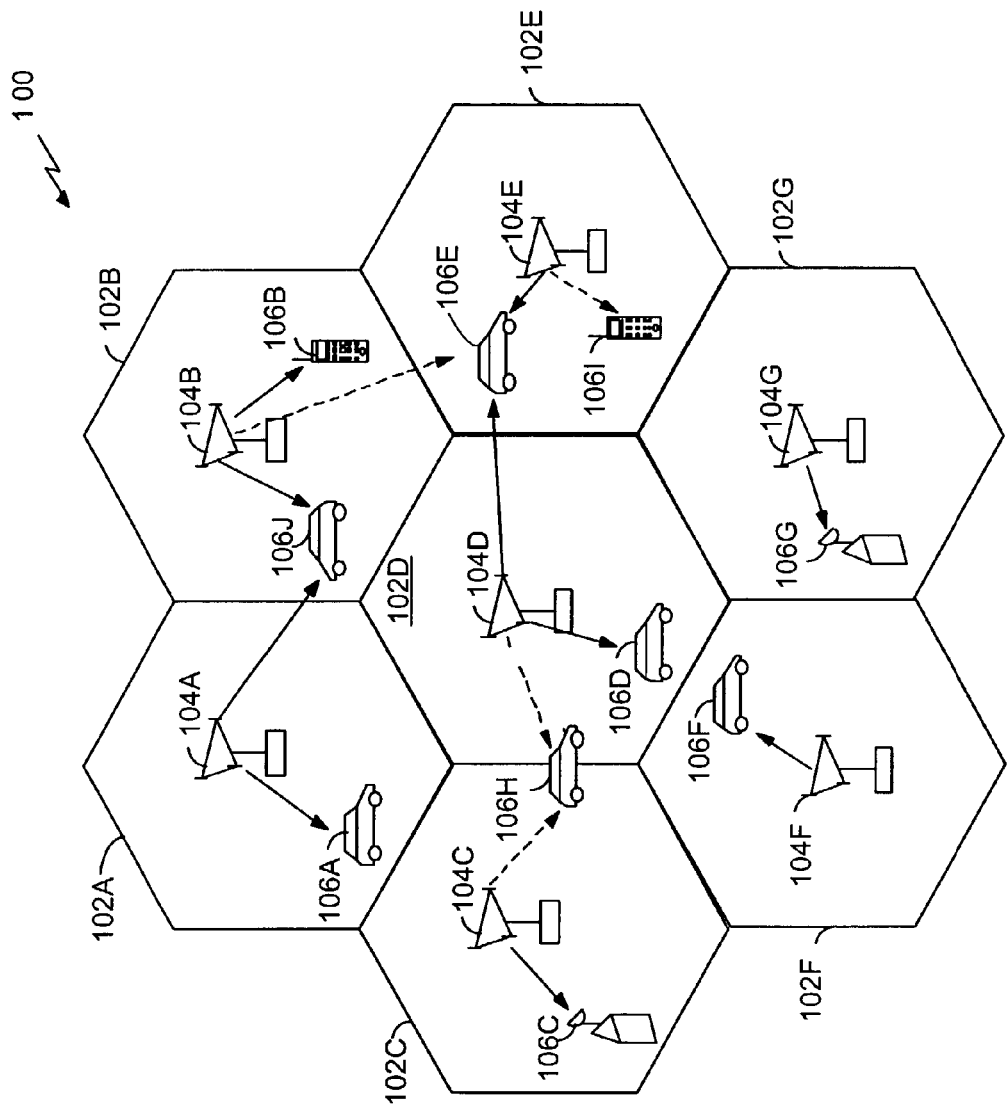
FIG. 1 is a diagram of a spread spectrum communication system that supports a number of users.

The word "exemplary" is used exclusively herein to mean "serving as an example, instance, or illustration." Any embodiment described herein as "exemplary" is not necessarily to be construed as preferred or advantageous over other embodiments. While the various aspects of the embodiments are presented in drawings, the drawings are not necessarily drawn to scale unless specifically indicated.

The following discussion develops the exemplary embodiments of data-driven adaptive and non-adaptive pilot estimators by first discussing a spread-spectrum wireless communication system. Then components of an embodiment of a mobile station are shown in relation to providing a pilot estimate. Before the pilot is estimated, a pilot estimation component is trained. Details regarding the offline system identification used to train the pilot estimation component are set forth. Included in the specification relating to the offline system identification are illustrations and mathematical derivations for a prediction error method (PEM) based on an innovations representation (IR) model (also known as a Wold model) of the noisy faded pilot symbols. The principles set forth herein improve stability and group delay performance over other prediction-error-method based algorithms. The iterative process of generating state estimates and calculating new parameters is discussed. Formulas for both offline system identification and real-time pilot estimating are illustrated. Several embodiments for both offline system identification and real-time pilot estimation are shown.

Note that the exemplary embodiment is provided as an exemplar throughout this discussion; however, alternate embodiments may incorporate various aspects without departing from the scope of the present invention.

The exemplary embodiment employs a spread-spectrum wireless communication system. Wireless communication systems are widely deployed to provide various types of communication such as voice, data, and so on. These systems may be based on CDMA, TDMA, or some other modulation techniques. A CDMA system provides certain advantages over other types of systems, including increased system capacity.

A system may be designed to support one or more standards such as the "TIA/EIA/IS-95-B Mobile Station-Base Station Compatibility Standard for Dual-Mode Wideband Spread Spectrum Cellular System" referred to herein as the IS-95 standard, the standard offered by a consortium named "3rd Generation Partnership Project" referred to herein as 3GPP, and embodied in a set of documents including Document Nos. 3G TS 25.211, 3G TS 25.212, 3G TS 25.213, and 3G TS 25.214, 3G TS 25.302, referred to herein as the W-CDMA standard, the standard offered by a consortium named "3rd Generation Partnership Project 2" referred to herein as 3GPP2, and TR-45.5 referred to herein as the cdma2000 standard, formerly called IS-2000 MC. The standards cited hereinabove are hereby expressly incorporated herein by reference.

Each standard specifically defines the processing of data for transmission from base station to mobile, and vice versa. As an exemplary embodiment the following discussion considers a spread-spectrum communication system consistent with the CDMA2000 standard of protocols. Alternate embodiments may incorporate another standard.

FIG. 1 serves as an example of a communications system 100 that supports a number of users and is capable of implementing at least some aspects of the embodiments discussed herein. Any of a variety of algorithms and methods may be used to schedule transmissions in system 100. System 100 provides communication for a number of cells 102A–102G, each of which is serviced by a corresponding base station 104A–104G, respectively. In the exemplary embodiment, some of the base stations 104 have multiple receive antennas and others have only one receive antenna. Similarly, some of the base stations 104 have multiple transmit antennas, and others have single transmit antennas. There are no restrictions on the combinations of transmit antennas and receive antennas. Therefore, it is possible for a base station 104 to have multiple transmit antennas and a single receive antenna, or to have multiple receive antennas and a single transmit antenna, or to have both single or multiple transmit and receive antennas.

Terminals 106 in the coverage area may be fixed (i.e., stationary) or mobile. As shown in FIG. 1, various terminals 106 are dispersed throughout the system. Each terminal 106 communicates with at least one and possibly more base stations 104 on the downlink and uplink at any given moment depending on, for example, whether soft handoff is employed or whether the terminal is designed and operated to (concurrently or sequentially) receive multiple transmissions from multiple base stations. Soft handoff in CDMA communications systems is well known in the art and is described in detail in U.S. Pat. No. 5,101,501, entitled "Method and System for Providing a Soft Handoff in a CDMA Cellular Telephone System", which is assigned to the assignee of the present invention.

The downlink refers to transmission from the base station 104 to the terminal 106, and the uplink refers to transmission from the terminal 106 to the base station 104. In the exemplary embodiment, some of terminals 106 have multiple receive antennas and others have only one receive antenna. In FIG. 1, base station 104A transmits data to terminals 106A and 106J on the downlink, base station 104B transmits data to terminals 106B and 106J, base station 104C transmits data to terminal 106C, and so on.

Figure 2:
FIG. 2 is a block diagram of a base station and a mobile station in a communications system.

FIG. 2 is a block diagram of the base station 202 and mobile station 204 in a communications system. A base station 202 is in wireless communications with the mobile station 204. As mentioned above, the base station 202 transmits signals to mobile stations 204 that receive the signals. In addition, mobile stations 204 may also transmit signals to the base station 202.

Figure 3:
FIG. 3 is a block diagram illustrating the downlink and the uplink between the base station and the mobile station.

FIG. 3 is a block diagram of the base station 202 and mobile station 204 illustrating the downlink 302 and the uplink 304. The downlink 302 refers to transmissions from the base station 202 to the mobile station 204, and the uplink 304 refers to transmissions from the mobile station 204 to the base station 202.

Figure 4:
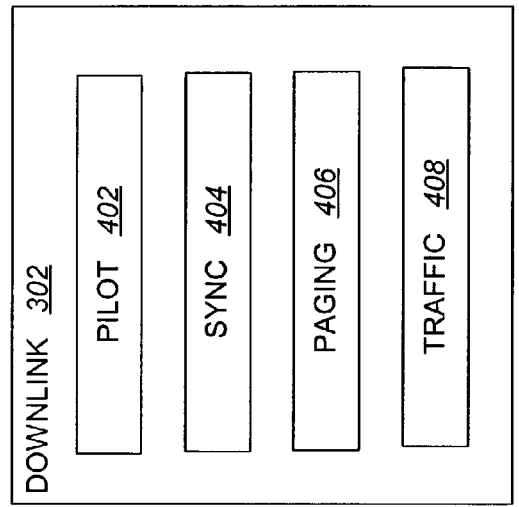
FIG. 4 is a block diagram of the channels in an embodiment of the downlink.

FIG. 4 is a block diagram of the channels in an embodiment of the downlink 302. The downlink 302 includes the pilot channel 402, the sync channel 404, the paging channel 406 and the traffic channel 408. The downlink 302 illustrated is only one possible embodiment of a downlink and it will be appreciated that other channels may be added or removed from the downlink 302.

Although not illustrated, the uplink 304 may also include a pilot channel. Recall that third-generation (3G) wireless radiotelephone communication systems have been proposed in which an uplink 304 pilot channel is used. For example, in the currently proposed cdma2000 standard, the mobile station transmits a Reverse Link Pilot Channel (R-PICH) that the base station uses for initial acquisition, time tracking, rake-receiver coherent reference recovery, and power control measurements. Thus, systems and methods herein may be used to estimate a pilot signal whether on the downlink 302 or on the uplink 304.

Under one CDMA standard, described in the Telecommunications Industry Association's TIA/EIA/IS-95-A Mobile Stations-Base Station Compatibility Standard for Dual-Mode Wideband Spread Spectrum Cellular System, each base station 202 transmits pilot 402, sync 404, paging 406 and forward traffic 408 channels to its users. The pilot channel 402 is an unmodulated, direct-sequence spread spectrum signal transmitted continuously by each base station 202. The pilot channel 402 allows each user to acquire the timing of the channels transmitted by the base station 202, and provides a phase reference for coherent demodulation. The pilot channel 402 also provides a means for signal strength comparisons between base stations 202 to determine when to hand off between base stations 202 (such as when moving between cells).

Figure 5:
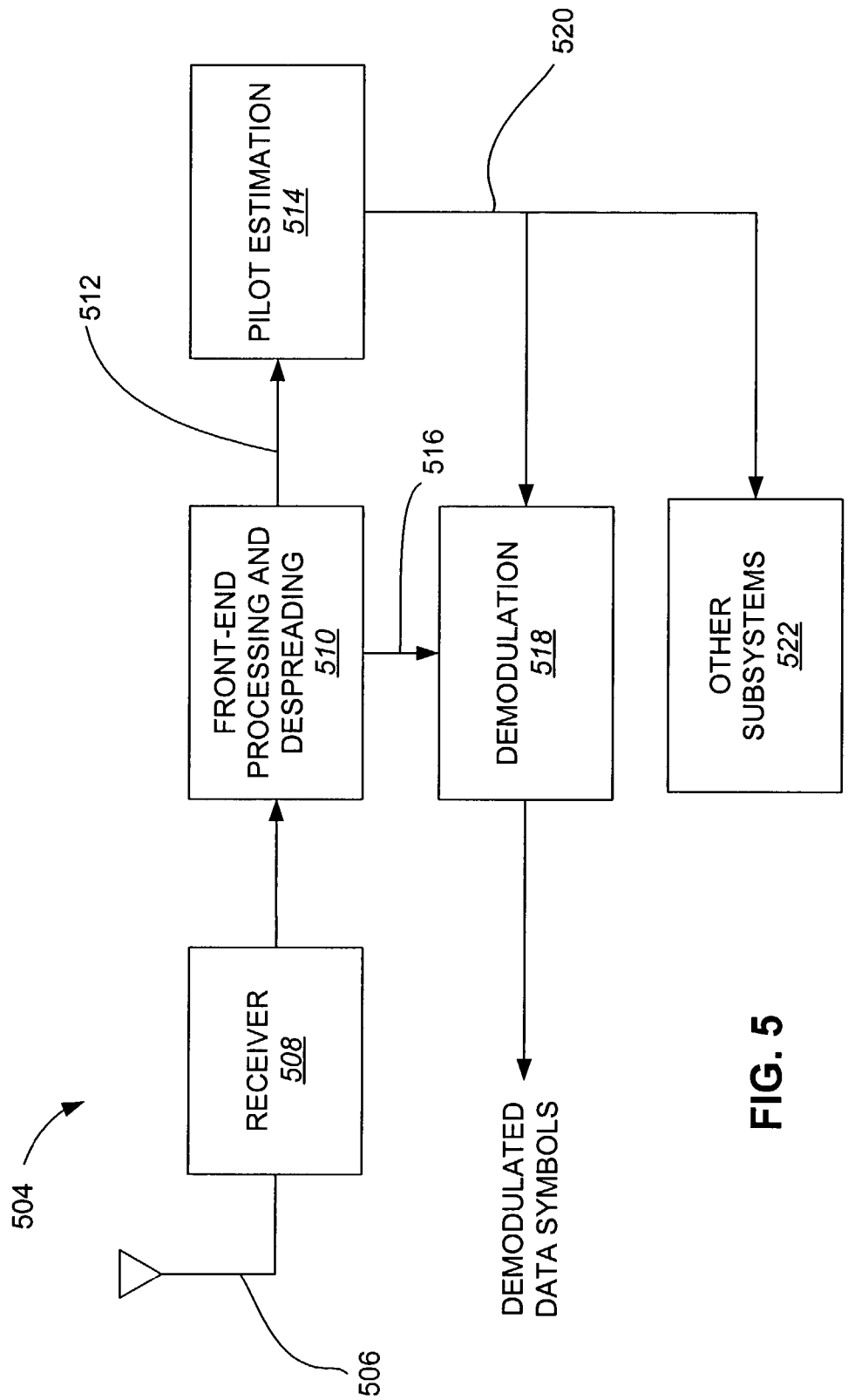
FIG. 5 illustrates a block diagram of certain components in an embodiment of a mobile station.

FIG. 5 illustrates a block diagram of certain components in an embodiment of a mobile station 504. Other components that are typically included in the mobile station 504 may not be illustrated for the purpose of focusing on the novel features of the embodiments herein. Many embodiments of mobile stations 504 are commercially available and, as a result, those skilled in the art will appreciate the components that are not shown.

If the pilot channel 402 were being sent on the uplink 304, the components illustrated may be used in a base station 202 to estimate the pilot channel. It is to be understood that the inventive principles herein may be used with a variety of components to estimate a pilot whether the pilot is being received by a mobile station 504, a base station 202, or any other component in a wireless communications system. Thus, the embodiment of a mobile station 504 is an exemplary embodiment of the systems and methods but it is understood that the systems and methods may be used in a variety of other contexts.

Referring again to FIG. 5, a spread spectrum signal is received at an antenna 506. The spread spectrum signal is provided by the antenna 506 to a receiver 508. The receiver 508 down-converts the signal and provides it to the front-end processing and despreading component 510. The front-end processing and despreading component 510 provides the received pilot signal 512 to the pilot estimation component 514. The received pilot signal 512 typically includes noise and usually suffers from fading.

The front-end processing and despreading component 510 also provides the traffic channel 516 to a demodulation component 518 that demodulates the data symbols.

The pilot estimation component 514 provides an estimated pilot signal 520 to the demodulation component 518. The pilot estimation component 514 may also provide the estimated pilot signal 520 to other subsystems 522.

It will be appreciated by those skilled in the art that additional processing takes place at the mobile station 504. The embodiment of the pilot estimation component 514 will be more fully discussed below. Generally, the pilot estimation component 514 operates to estimate the pilot signal and effectively clean up the pilot signal by reducing the noise and estimating the original pilot signal that was transmitted.

Systems and methods disclosed herein use a Kalman filter to estimate the pilot signal. Kalman filters are known by those skilled in the art. In short, a Kalman filter is an optimal recursive data processing algorithm. A Kalman filter takes as inputs data relevant to the system and estimates the current value(s) of variables of interest. A number of resources are currently available that explain in detail the use of Kalman filters. A few of these resources are "Fundamentals of Kalman Filtering: A Practical Approach" by Paul Zarchan and Howard Musoff, "Kalman Filtering and Neural Networks" by Simon Haykin and "Estimation and Tracking: Principles, Techniques And Software" by Yaakov Bar-Shalom and X. Rong Li, all of which are incorporated herein by reference.

FIG. 6 is a flow diagram 600 of one embodiment of a method for estimating the pilot using a Kalman filter. The system receives 602 the baseband CDMA signal. Then the front-end processing and despreading component 510 performs initial processing and despreading 604. The received pilot signal is then provided 606 to the pilot estimation component 514. The received pilot signal has been degraded by various effects, including noise and fading. The pilot estimation component 514 estimates 608 the pilot channel using a Kalman filter. After the pilot has been estimated 608, it is provided 610 to the demodulation component 518 as well as other subsystems 522.

Referring now to FIG. 7, before the Kalman filter in the pilot estimation component 514 is used, the parameters of the Kalman filter are determined during a training period. As shown, an offline system identification component 702 is used to determine the parameters needed by the Kalman filter. Offline training data is input to the offline system identification component 702 in order to determine the needed parameters. Once the parameters have converged, they are provided to the pilot estimation component 714 and its Kalman filter, to process the received pilot and estimate the original pilot in real time. In the embodiments disclosed herein, the offline system identification component 702 is used once to set up the parameters. After the parameters have been determined, the system uses the pilot estimation component 714 and no longer needs the offline system identification component 702.

Typically the offline system identification 702 is used before a component is being used by the end user. For example, if the system and methods were being used in a mobile station 204, when an end user was using the mobile station 204, it 204 would be using the pilot estimation component 714 to process the pilot in real-time. The offline system identification component 702 is used before the mobile station 204 is operating in real-time to determine the parameters needed to estimate the pilot.

The following discussion provides details regarding the calculations that will be made in the offline system identification component 702 as well as the pilot estimation component 714. Additional details and derivations known by those skilled in the art are not included herein.

The received pilot complex envelope after despreading is given by the following formula:

$$\tilde{y}_k = \tilde{s}_k + \tilde{v}_k \quad \text{Formula 1.}$$

The received complex envelope in Formula 1 is represented as $\tilde{y}_k$. The original but faded pilot signal is represented as $\tilde{s}_k$. The noise component is represented as $\tilde{v}_k$. For a single path mobile communication channel, the original pilot signal may be represented by the mathematical model found in Formula 2. The corresponding noise component may be represented by the formula found in Formula 3.

$$\tilde{s}_k = \rho_k e^{j\phi_k} R_{hh}(\tau) = g_k N\sqrt{E_c^P} R_{hh}(\tau) \tilde{f}_k \quad \text{Formula 2.}$$

$$\tilde{v}_k = g_k\sqrt{NI_{oc}}\,\tilde{n}_k + g_k\sqrt{NI_{or}} \sum_{m=-\infty, m\neq k}^{+\infty} R_{hh}(mT_c - \tau)\tilde{w}_k \quad \text{Formula 3.}$$

The variables and parameters in the formulas found in Formulas 2 and 3 are given in Table 1.

TABLE 1

| | |
|---|---|
| $\sqrt{E^P}$: | Pilot Envelope |
| $I_{oc}$: | Total AWGN Noise |
| $I_{or}$: | Total Transmit PSD |
| $g_k$: | AGC Control Signal |
| $\rho_k$: | Rice (Rayleigh) Fade Process |
| $\tilde{f}_k$: | Complex Gaussian Fade Process with Clark Spectrum |
| $\phi_k$: | Fading Phase |
| m, k: | Chip and Symbol Counts |
| N: | Processing Gain |
| $R_{hh}(\tau)$: | Correlation |
| $\tau$: | Time Offset |
| $\tilde{n}_k, \tilde{w}_k$: | Zero Mean Unit Power Gaussian Noise |

The demodulation component 518 requires the phase of the pilot signal. In order to obtain the phase, the signals may be written in a form comprising I and Q components rather than being written in an envelope form. In Formula 4, $\tilde{y}$ represents the received pilot comprising its I and Q components. The faded pilot, without any noise, is represented as $\tilde{s}$ in Formula 5. The total noise is represented in Formula 6 as $\tilde{v}$. Formula 7 illustrates the fade as $\tilde{f}$.

$$\tilde{y} = y_I + jy_Q \quad \text{Formula 4.}$$

$$\tilde{s} = s_I + js_Q \quad \text{Formula 5.}$$

$$\tilde{v} = v_I + jv_Q \quad \text{Formula 6.}$$

$$\rho e^{j\phi} = f_I + jf_Q = \tilde{f} \quad \text{Formula 7.}$$

Given the relationships of the formulas above, the I and Q components of the faded pilot symbol without noise may be written as shown in Formulas 8 and 9.

$$s_I(k) = f_I(k) N \sqrt{E_c P} R_{hh}(\tau) g(k) \quad \text{Formula 8.}$$

$$s_Q(k) = f_Q(k) N \sqrt{E_c P} R_{hh}(\tau) g(k) \quad \text{Formula 9.}$$

Those skilled in the art will appreciate that the Wold decomposition theorem may be used to model a time series. According to Wold's decomposition, a time series can be decomposed into predictable and unpredictable components. The unpredictable component of the time series (under well-known spectral decomposition conditions) can be expanded in terms of its innovations. The Wold expansion of observations $y_k$ may be approximated by a finite-dimensional ARMA Model as shown in Formula 10. The approximate innovations are represented by $e_k$ and it is assumed that $E(e_k|Y_{k-1}) = 0$. The optimal estimator may be propagated on Formula 10 resulting in three alternative forms as shown in Formulas 11, 13 and 16. The approximate innovations, represented by $e_k$, is also the prediction error, as shown in Formula 12. The equalities found in Formulas 14 and 15 are assumed for Formula 13. Formulas 11, 13 and 16 are three alternative forms for the one-step predictor.

$$-y_k - a_1 y_{k-1} - \ldots - a_n y_{k-n} = e_k - d_1 e_{k-1} - \ldots - d_m e_{k-m} \quad \text{Formula 10.}$$

$$-\hat{y}_k = \hat{y}_{k|k-1} = E(y_k|Y_{k-1}) = a_1 y_{k-1} + \ldots + a_n y_{k-n} - d_1 e_{k-1} - \ldots - d_m e_{k-m} \quad \text{Formula 11.}$$

$$e_k = y_k - \hat{y}_{k|} \quad \text{Formula 12.}$$

$$-\hat{y}_k = a_1 \hat{y}_{k-1} + \ldots + a_n \hat{y}_{k-n} + L_1 e_{k-1} + \ldots + L_m e_{k-m} \quad \text{Formula 13.}$$

$$\hat{y}_k = \hat{y}_{k|k-1} \quad \text{Formula 14.}$$

$$L_i = a_i - d_i \quad \text{Formula 15.}$$

$$-\hat{y}_k = d_1 \hat{y}_{k-1} + \ldots + d_n \hat{y}_{k-n} + L_1 y_{k-1} + \ldots + L_1 y_{k-m} \quad \text{Formula 16.}$$

Formulas 17–19 illustrate the first order (let x=y) one-step predictors. Formula 17 is the first order one-step predictor that corresponds with Formula 11. Formula 18 is the first order one-step predictor that corresponds with Formula 13. Formula 19 is the first order one-step predictor that corresponds with Formula 16.

$$-\hat{x}_{k+1} = a\hat{x}_k + Le_k = [\hat{x}_k e_k][a\ L]^T \quad \text{Formula 17.}$$

$$-\hat{x}_{k+1} = ay_k - de_k = [y_k - e_k][a\ d]^T \quad \text{Formula 18.}$$

$$-\hat{x}_{k+1} = d\hat{y}_k + Ly_k = [\hat{y}_k\ y_k][d\ L]^T \quad \text{Formula 19.}$$

As discussed earlier, the received pilot complex envelope after despreading is given by Formula 20. The Wold-decomposition may also be accomplished on the pilot signal without noise $s_k$. Performing the Wold-decomposition on $s_k$ results in a filtered estimate of the pilot which has improved group delay. The innovations (residuals or prediction errors) are given by Formulas 21 and 22. Formula 21 illustrates the S-Wold innovations, and Formula 22 illustrates the Y-Wold innovations.

$$y_k = s_k + v_k \quad \text{Formula 20.}$$

$$w_{k-1} = s_k - E\{s_k|S_{k-1}\} \quad \text{Formula 21.}$$

$$e_k = y_k - E\{y_k|Y_{k-1}\} \quad \text{Formula 22.}$$

The resulting finite-dimensional approximate ARMA models are shown in Formulas 23 and 24. Formula 23 illustrates the resulting finite-dimensional approximate ARMA model on s, and Formula 24 illustrates the resulting finite-dimensional approximate ARMA model on y. Regarding Formula 23, $b_1 = 1$.

$$s_k - a_1 s_{k-1} - \ldots - a_n s_{k-n} = b_1 w_{k-1} + \ldots + b_n w_{k-n} \quad \text{Formula 23.}$$

$$y_k - a_1 y_{k-1} - \ldots - a_n y_{k-n} = e_k - d_1 e_{k-1} - \ldots - d_n e_{k-n} \quad \text{Formula 24.}$$

The S-Wold and Y-Wold innovations have the same poles because $y_k = s_k + v_k$.

The measurement model for the pilot signal is shown in Formula 20 above. This is the measurement model for both the I and the Q components of the pilot signal. The one-step ahead minimum mean-square error (MMSE) predictors are shown in Formulas 25 and 26. The solution is known by those skilled in the art to be as shown in Formulas 27 and 28.

$$\hat{y}_k = \underset{\hat{y}_k(Y_{k-1})}{\mathrm{ArgMin}} \{E(y_k - \hat{y}_k)^2\} \quad \text{Formula 25.}$$

$$\hat{s}_k = \underset{\hat{s}_k(Y_{k-1})}{\mathrm{ArgMin}} \{E(s_k - \hat{s}_k)^2\} \quad \text{Formula 26.}$$

$$\hat{y}_k = E\{y_k|y_{k-1}, \ldots, y_k\} = E\{s_k + v_k|Y_{k-1}\} \quad \text{Formula 27.}$$

$$\hat{y}_k = E\{s_k|Y_{k-1}\} \hat{s}_k \quad \text{Formula 28.}$$

Given $Y_{k-1}$, the one-step predictor of $y_k$ and $s_k$ are the same as shown earlier and can be found from the Y-Wold alone. However, it is desirable to obtain $\hat{s}_k^+ = E\{s_k|Y_k\}$. The term $\hat{s}_k^+$ is the true filtered estimate having improved group delay.

In order to gain insight into the form of $\hat{s}_k^+$, Formulas 29–31 express the ARMA plus the measurement noise model in the equivalent n-dimensional State Space form.

$$x_{k+1} = Ax_k + Bw_k \quad \text{Formula 29.}$$

$$s_k = Cx_k \quad \text{Formula 30.}$$

$$y_k = s_k + v_k = Cx_k + v_k \quad \text{Formula 31.}$$

The system matrices B, C and A are given by the following expressions found in Formulas 32–34. A is an n×n matrix, B is an n×1 matrix and C is a 1×n matrix. Relating to Formula 32, the value of $b_1$ may be set to $b_1 = 1$ with no loss of generality.

$$B = \begin{pmatrix} b_1 \\ \vdots \\ b_n \end{pmatrix} \quad \text{Formula 32.}$$

$$C = (1 \quad 0 \quad \cdots \quad 0) \quad \text{Formula 33.}$$

-continued $$A = \begin{pmatrix} a_1 & 1 & 0 & 0 & \cdots & 0 & 0 \\ a_2 & 0 & 1 & 0 & \cdots & 0 & 0 \\ a_3 & 0 & 0 & 1 & \cdots & 0 & 0 \\ \vdots & \vdots & \vdots & \vdots & \ddots & \vdots & \vdots \\ a_{n-1} & 0 & 0 & 0 & \cdots & 0 & 1 \\ a_n & 0 & 0 & 0 & \cdots & 0 & 0 \end{pmatrix} \quad \text{Formula 34.}$$

A Kalman filter may be constructed from the state space model to obtain a single-step predictor $\hat{x}_k$ and a filtered estimate $\hat{x}_k^+$. The steady-state one-step predictor Kalman filter for the model is as shown in Formulas 35 and 36. The term $\hat{x}_k$ is as shown in Formula 37. The innovation sequence for the observation is $e_k$. The true filtered estimate $\hat{x}_k^+$ is shown in Formula 38. The expression for $s_k^+$ is shown in Formula 39. Formulas 40 and 41 illustrate expressions for L and K.

$$\hat{x}_{k+1} = (A - LC)\hat{x}_k + Ly_k = A\hat{x}_k + L(y - C\hat{x}_k) = A\hat{x}_k + Le_k \quad \text{Formula 35.}$$

$$e_k = y_k - C\hat{x}_k = y_k - \hat{y}_k \quad \text{Formula 36.}$$

$$\hat{x}_k = \hat{x}_{k|k-1} = E\{x_k | y_0, y_1, \ldots, y_{k-1}\}, \hat{y}_k = \hat{s}_k = C\hat{x}_k \quad \text{Formula 37.}$$

$$\hat{x}_k^+ = \hat{x}_{k|k} = (I - KC)\hat{x}_k + Ky_k = \hat{x}_k + K(y_k - C\hat{x}_k) = \hat{x}_k + Ke_k \quad \text{Formula 38.}$$

$$s_k^+ = C\hat{x}_k^+ = C\hat{x}_k + CKe_k = s_k + CKe_k \quad \text{Formula 39.}$$

$$L = \frac{a\sum_{11}}{\sum_{11} + P_v} \quad \text{Formula 40.}$$

$$\frac{L}{a} \triangleq K \quad \text{Formula 41.}$$

The S-Wold based adaptation provides $\hat{s}_k^+$ with improved group delay, whereas Y-Wold only gives $\hat{y}_k = \hat{s}_k$. An expression for $\hat{s}_k^+$ is shown in Formula 42, and an expression for $-\hat{s}_k$ is shown in Formula 43.

$$\hat{s}_k^+ = E\{s_k | Y_k\} = \hat{s}_k + CKe_k \quad \text{Formula 42.}$$

$$-\hat{s}_k = E\{s_k | Y_{k-1}\} \quad \text{Formula 43.}$$

The S-Wold provides model statistics. For example, the S-Wold provides the signal-to-noise ratio (SNR). However, the Y-Wold does not provide model statistics.

Adaptation constraints on S-Wold serve to enforce stability and performance. The adaptation constraints for the S-Wold are superior to many other adaptation constraints. Another benefit from the S-Wold is that the S-Wold allows the model-measurement noise-correlations to partially compensate the modeling error.

Because the X-Wold is related to the Y-Wold, it may be determined that $K = \hat{L}_n/\hat{a}_n$. From $K = \hat{L}_n/\hat{a}_n$ the filtered estimate $\hat{s}_k^+ = \hat{s}_k + CK(y_k - \hat{s}_k) = E\{s_k | Y_k\}$ may be obtained. This filtered estimate has a better group delay property and a smaller estimator error covariance.

Because the X-Wold is related to the Y-Wold and because a Kalman filter is being used, the novel estimates for the following may be obtained. The signal prediction error covariance is shown in Formula 44. The signal filtered estimate error covariance is shown in Formula 45. The measurement noise power is expressed in Formula 46. The signal power estimate is shown in Formula 47.

$$\sum_{11} = cov(\hat{s}_k - s_k). \quad \text{Formula 44}$$

$$\sum_{11}^+ = cov(\hat{s}_k^+ - s_k). \quad \text{Formula 45}$$

$$P_v = cov(v_k) \quad \text{Formula 46.}$$

$$P_s = cov(s_k) \quad \text{Formula 47.}$$

New stability and statistical consistency tests may be implemented to improve stability and performance. The stability test performed may be to determine if the poles of the Kalman Filter and of the innovations models are inside the $(1-\in$ circle). The performance test may enforce the statistical constraints as shown in Formulas 48 and 49 for improved online use.

$$d_n \cdot \overline{L}_n > 0 \quad \text{Formula 48.}$$

$$K_1 = \frac{\sum_{11}^+}{\sum_{11} + R} = \frac{\sum_{11}^+}{R} < K_{\max} < 1 \quad \text{Formula 49.}$$

The pilot estimation component 714 operates to take as input the received pilot signal which is noisy and faded to produce an estimate of the pilot signal. A Kalman filter may be used in real-time to estimate the pilot. In the training state, the Kalman filter is trained on training data. A parameter estimation component estimates parameters, discussed below, and provides the parameters to the Kalman filter. The Kalman filter uses the parameters and provides a state estimate to the parameter estimation component. The process shown is iterated through until the parameters for the Kalman filter have converged.

The aforementioned derivations and principles may be used to enhance prediction-error-method based algorithms for improved stability and group delay performance. The following embodiments illustrate the application of the inventive principles set forth herein. It will be appreciated by those skilled in the art that the inventive principles herein may also be applied to many other contexts and applications to improve stability and group delay performance.

Figure 8:
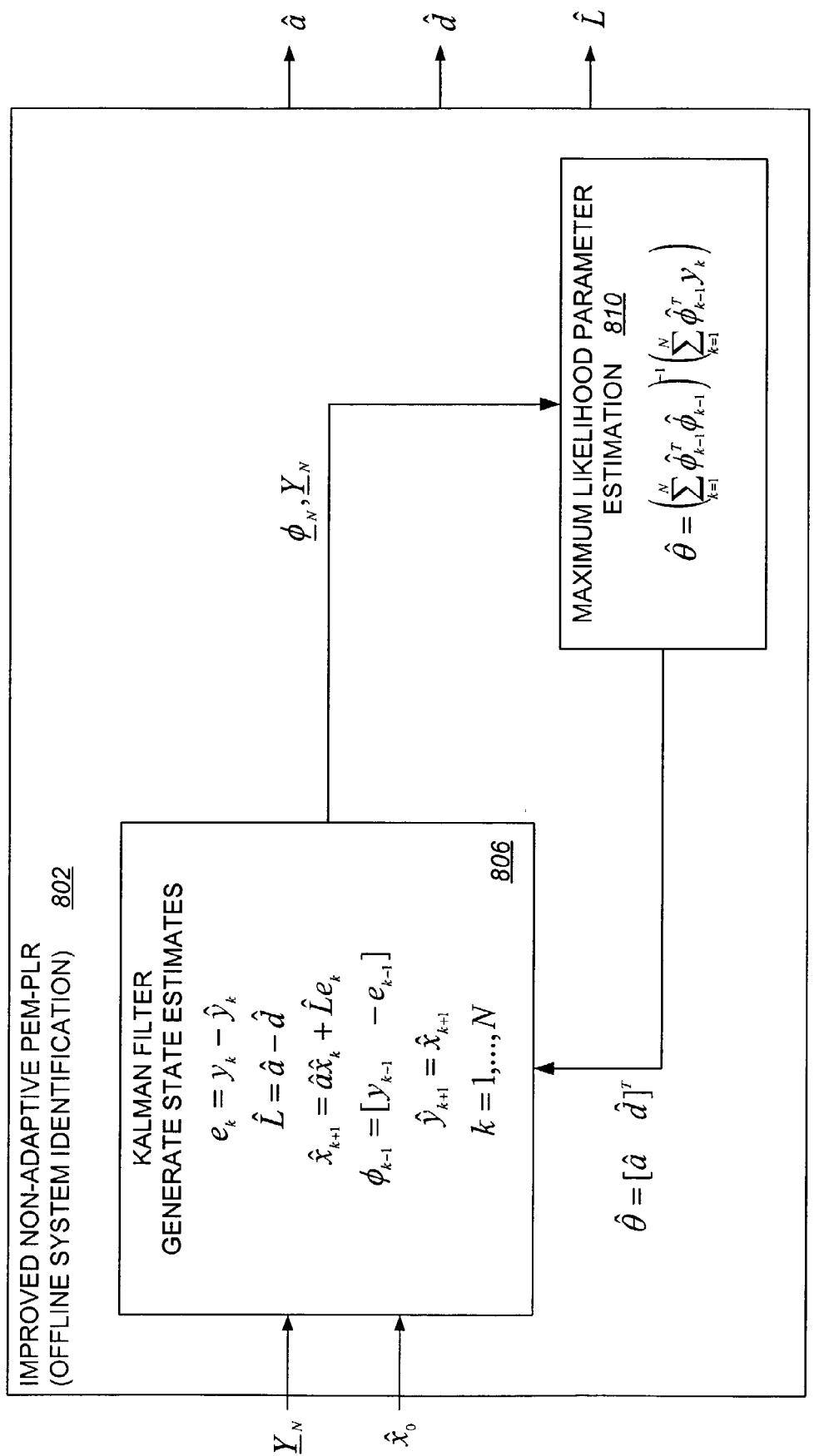
FIG. 8 is a block diagram illustrating an embodiment of an offline system identification operation.
Figure 9:
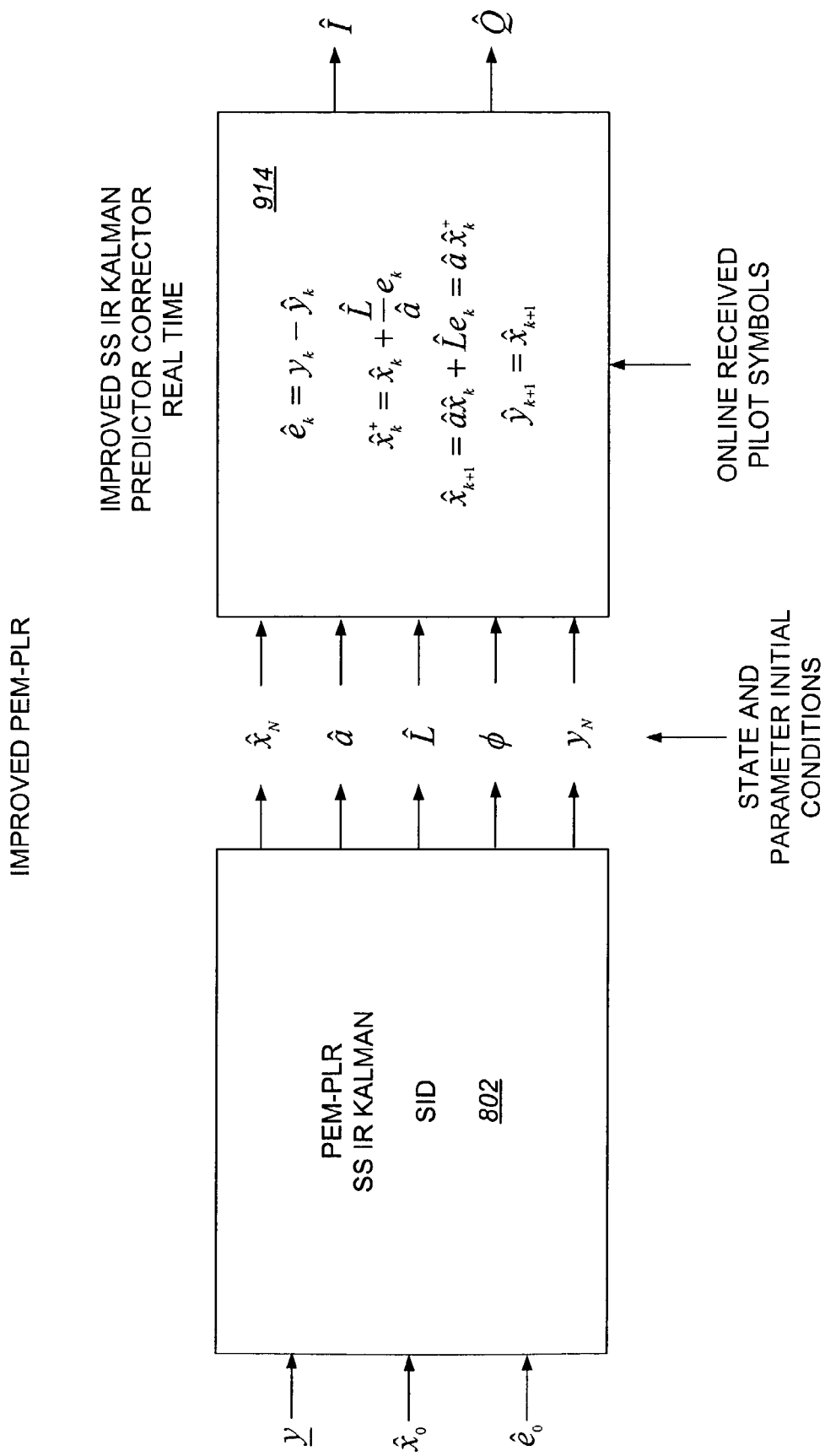
FIG. 9 is a block diagram illustrating inputs to and outputs from embodiments of the offline system identification component and pilot estimation component.

FIGS. 8–9 are block diagrams that illustrate modifications to and improvements of "Method And Apparatus For Pilot Estimation Using A Prediction Error Method With A Kalman Filter And Pseudo-Linear Regression" by Farrokh Abrishamkar et al., U.S. application Ser. No. 10/262,111, filed on Sep. 30, 2002, which is expressly incorporated by reference herein.

FIG. 8 is a block diagram illustrating the offline system identification ("SID") operation 802. The embodiment of FIG. 8 uses Prediction Error Method ("PEM") and Pseudo-Linear Regression ("PLR"). The offline system identification 802 is non-adaptive. Initialized parameters are provided to the Kalman filter 806 to generate state estimates. In addition, training data $(Y_1, Y_2, \ldots Y_N)$ is also provided to the Kalman filter 806. With the initialized parameters and training data, the Kalman filter 806 generates a state estimate $\hat{X}_N = \{\hat{x}_0, \ldots, \hat{x}_N\}$. The new state estimate is provided to the maximum likelihood ("ML") parameter estimation component 810. The maximum likelihood parameter estimation component 810 calculates new parameter values using the equations as shown in FIG. 8. A state space model is formed, and the Kalman filter 806 generates new sequence state estimate. The Kalman filter 806 and the maximum likelihood parameter estimation component 810 continue to operate until the parameters have converged.

In the embodiment of FIG. 8, the training runs for the length of the pilot symbol record. In addition, the sequence of pilot symbols may be tuned to the target speed and environment of choice.

FIG. 9 is a block diagram illustrating the inputs to and outputs from the offline system identification component 802 and pilot estimation component 914. As noted, Pseudo-Linear Regression ("PLR") is used. The offline system identification component 802 is provided training samples $\underline{Y}_N$ and initial conditions $\hat{x}_0$ and $\hat{e}_0$. The system identification component 802 operates in an iterative fashion, as described above, until the necessary parameters have converged. After the system identification component 802 has completed training, it 802 provides the state, parameters and initial conditions to the pilot estimation component 914. The pilot estimation component 914 comprises the Kalman filter 806 operating in real-time. Thus, at this stage the Kalman filter 806 is no longer training, but is being used to estimate the pilot, given the received pilot as input.

As discussed above, the pilot estimation component 914 uses a Kalman filter to estimate the pilot. The calculations for the Kalman filter 806 operating in real-time are shown in FIG. 9. The Kalman filter 806 is provided the online received pilot symbols and estimates the pilot. As shown, the Kalman filter 806 produces an estimate for both the I and Q components of the pilot signal.

Figure 10:
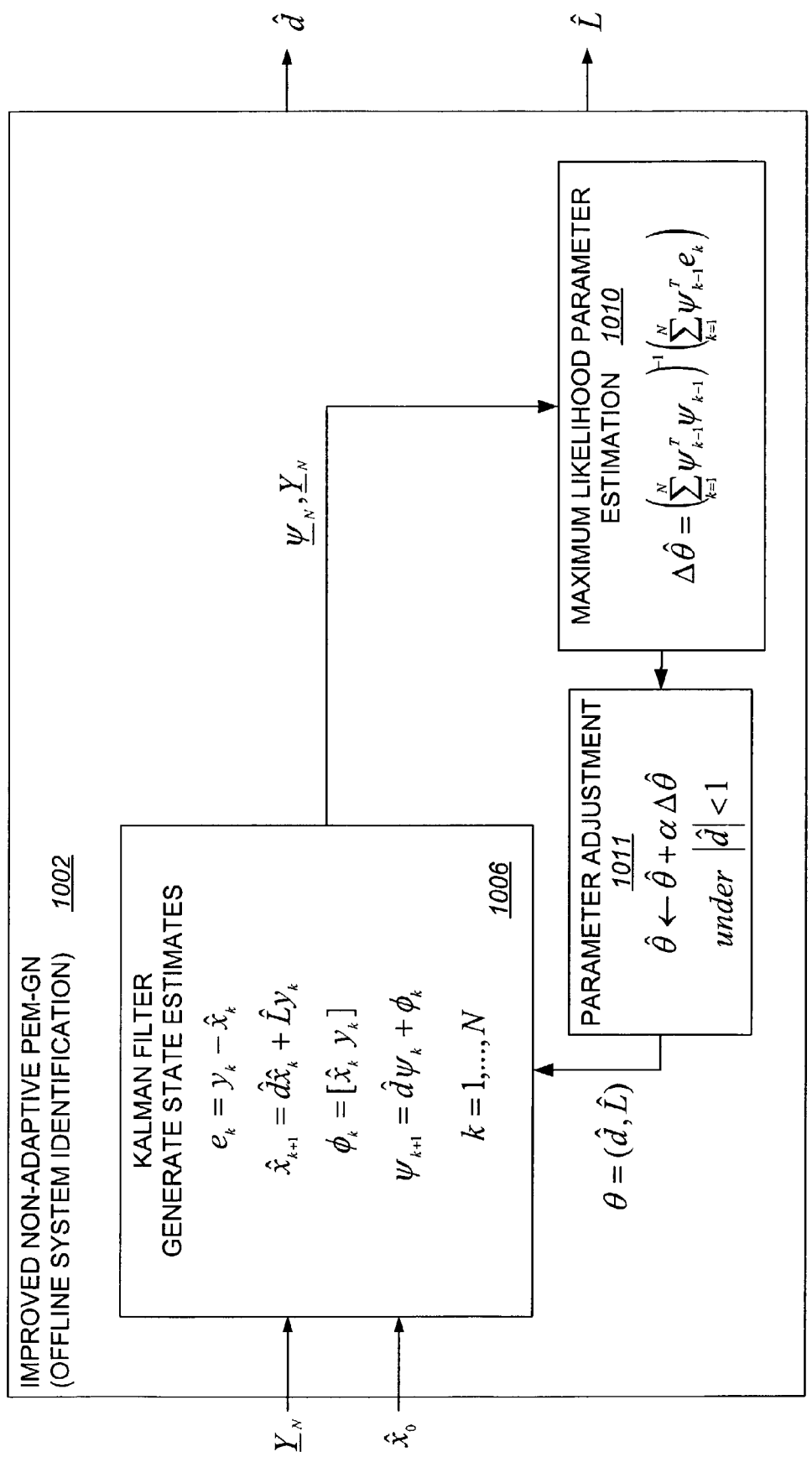
FIG. 10 is a block diagram illustrating another embodiment of an offline system identification operation.
Figure 11:
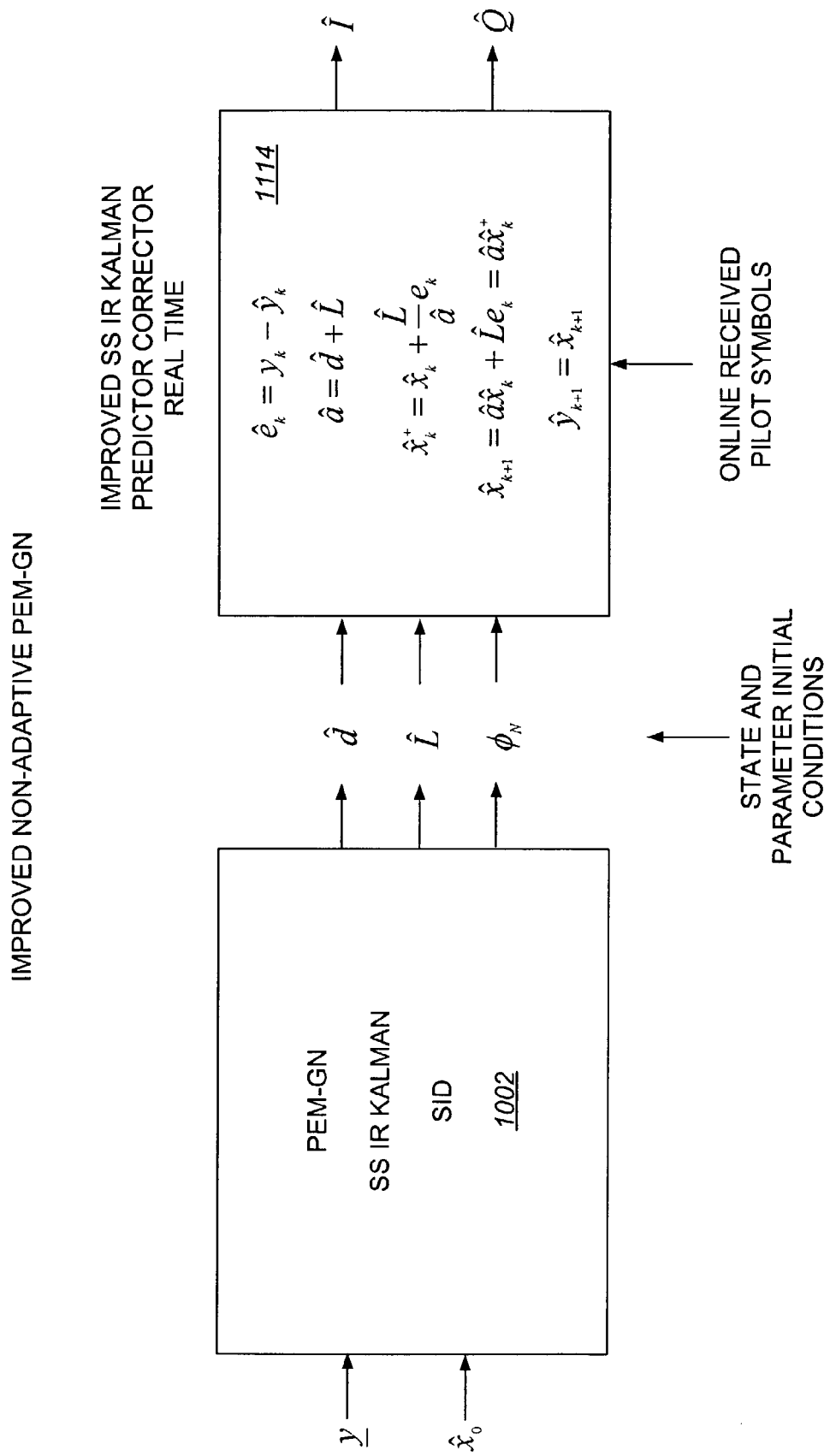
FIG. 11 is a block diagram illustrating inputs to and outputs from further embodiments of the offline system identification component and pilot estimation component.

FIGS. 10–11 are block diagrams that illustrate modifications of "Method And Apparatus For Pilot Estimation Using A Prediction Error Method With A Kalman Filter And A Gauss-Newton Algorithm" by Farrokh Abrishamkar et al., U.S. application Ser. No. 10/262,044, filed on Sep. 30, 2002, which is expressly incorporated by reference herein.

FIG. 10 is a block diagram illustrating another embodiment of the offline system identification operation 1002. A Gauss-Newton ("GN") algorithm is used. Initialized parameters are provided to the Kalman filter 1006 to generate state estimates. In addition, training data $(Y_1, Y_2, \ldots Y_N)$ is also provided to the Kalman filter 1006. With the initialized parameters and training data, the Kalman filter 1006 generates a state estimate $\hat{X}_N = \{\hat{x}_0, \ldots, \hat{x}_N\}$ according to the formulas as described above. The new state estimate is provided to the maximum likelihood parameter estimation component 1010.

The maximum likelihood parameter estimation component 1010 calculates new parameter values using the equations as shown in FIG. 10. A state space model is formed, and the Kalman filter 1006 generates new sequence state estimate. A parameter adjustment component 1011 may adjust the parameter θ according to the formula shown in the parameter adjustment component 1011 of FIG. 10 if |d|<1. The Kalman filter 1006 and the maximum likelihood parameter estimation component 1010 continue to operate until the parameters have converged.

In the embodiment of FIG. 10, the training runs for the length of the pilot symbol record. In addition, the sequence of pilot symbols may be tuned to the target speed and environment of choice.

FIG. 11 is a block diagram illustrating the inputs to and outputs from the offline system identification component 1002 and pilot estimation component 1114. A Gauss-Newton ("GN") algorithm is used. The offline system identification component 1002 is provided training samples $\underline{Y}_N$ and initial condition $\hat{x}_0$. The system identification component 1002 operates in an iterative fashion, as described above, until the necessary parameters have converged. After the system identification component 1002 has completed training, it 1002 provides the state, parameters and initial conditions to the pilot estimation component 1114. The pilot estimation component 1114 comprises the Kalman filter 1006 operating in real-time. Thus, at this stage the Kalman filter 1006 is no longer training, but is being used to estimate the pilot, given the received pilot as input.

As discussed above, the pilot estimation component 1114 uses a Kalman filter to estimate the pilot. The calculations for the Kalman filter 1006 operating in real-time are shown in FIG. 11. The Kalman filter 1006 is provided the online received pilot symbols and estimates the pilot. As shown, the Kalman filter 1006 produces an estimate for both the I and Q components of the pilot signal.

Figure 12:
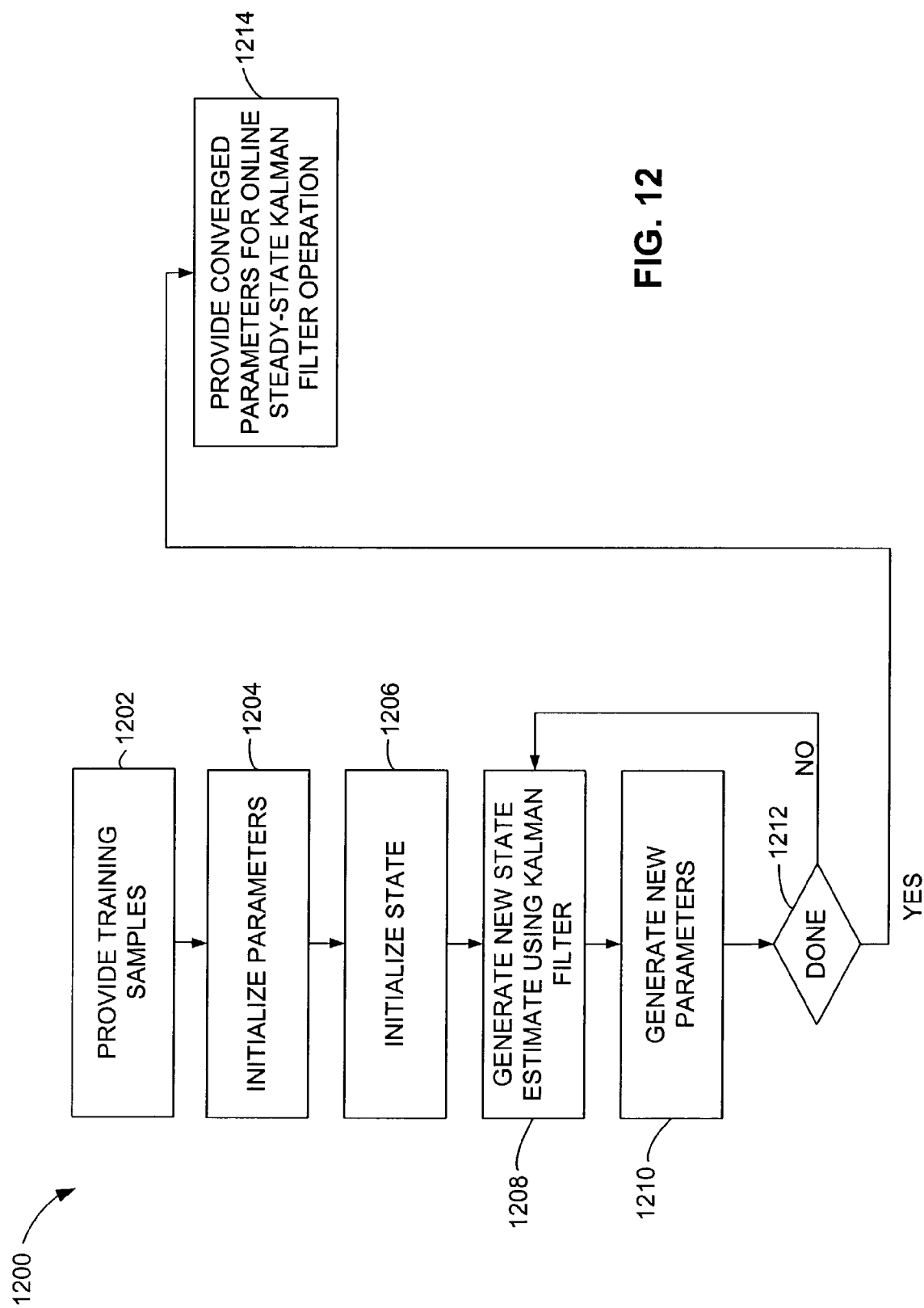
FIG. 12 is a flow diagram of a method for configuring a Kalman filter for steady state operation to estimate the pilot.

FIG. 12 is a flow diagram of a method for configuring a Kalman filter for steady state operation to estimate the pilot. Training samples are provided 1202 to the offline system identification component 702. The parameters are initialized 1204. In addition, the state is initialized 1206. Then the Kalman filter is used to generate 1208 a new state estimate. The parameter estimation component is used to generate 1210 new parameters. The generating steps 1208, 1210 are repeated 1212 until the filter and parameters have converged. Those skilled in the art will appreciate the various ways in which one may determine that the filter and parameters have converged. After the system has completed training the filter, the converged parameters are provided 1214 for online steady-state (real-time) Kalman filter operation.

Figure 13:
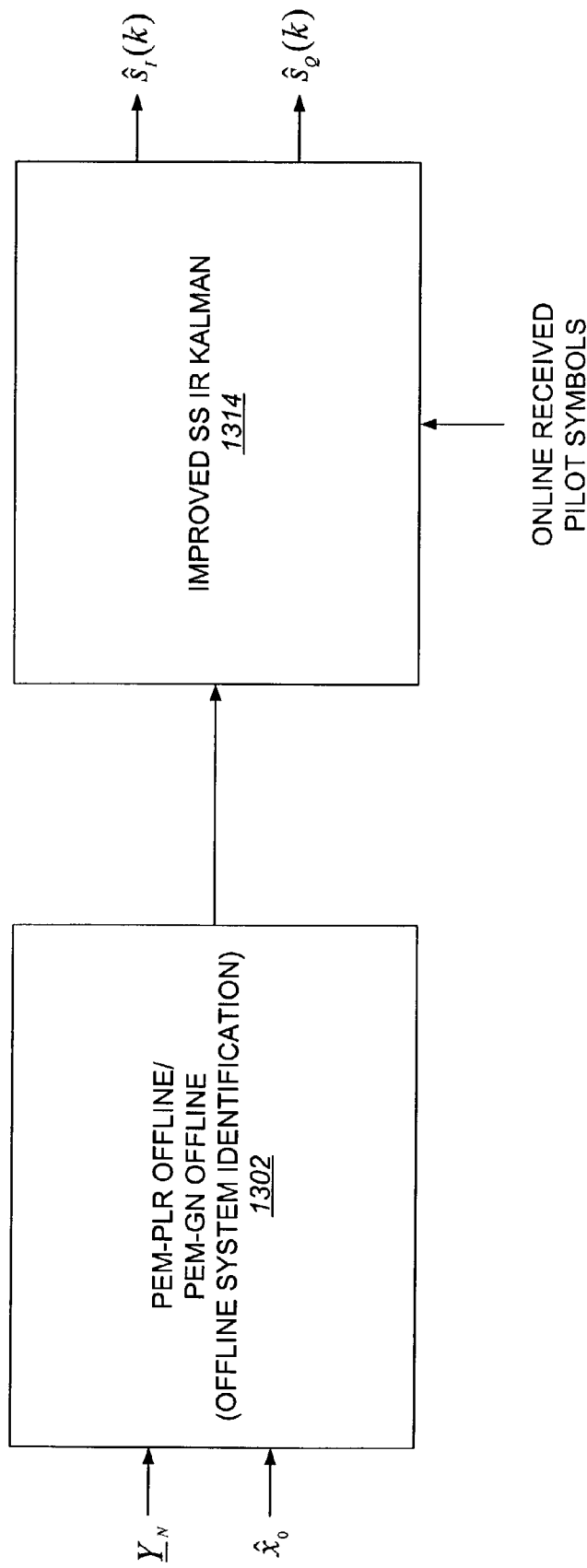
FIG. 13 is a block diagram illustrating the inputs to and outputs from embodiments of the offline system identification component and the pilot estimation component.

FIG. 13 is a block diagram illustrating the inputs to and outputs from general embodiments of an offline system identification component 1302 and a pilot estimation component 1314. The offline system identification component 1302 is provided training samples $\underline{Y}_N$ and initial condition $\hat{x}_0$. The system identification component 1302 operates in an iterative fashion, as described above, until the necessary parameters have converged. After the system identification component 1302 has completed training, it 1302 provides the state, parameters and initial conditions to the pilot estimation component 1314. The pilot estimation component 1314 comprises a Kalman filter operating in real-time. The pilot estimation component 1314, as described herein, estimates the pilot, given the received pilot as input.

As discussed above, the pilot estimation component 1314 uses a Kalman filter to estimate the pilot. The calculations for the Kalman filter operating in real-time and for the parameter estimations and adjustments are shown and discussed above. The Kalman filter is provided the online received pilot symbols and estimates the pilot. As shown, the Kalman filter produces an estimate for both the I and Q components of the pilot signal.

FIG. 14 is a block diagram of pilot estimation where the filtering is broken down into its I and Q components. The system identification component 702, using a Prediction Error Method, as described above, provides the initial conditions to the steady-state Kalman Predictor/Corrector (Innovation Form) 714. As shown, the processing for the I component is similar to the processing for the Q component. The particular component is provided to the Kalman Predictor 714. The Kalman Predictor 714 generates an estimated pilot for that component. The pilot estimate is then provided to the demodulation component 518 as well as other subsystems 522.

Use of a Kalman Predictor to estimate the pilot signal may be used for many different kinds of situations. One situation where a Kalman Predictor may be useful is when a user is moving at high speeds. For example, if the user were aboard a bullet train his or her speed on the train may reach speeds of approximately 500 km/hr. Estimating the pilot signal using a Kalman Predictor in such situations may provide better results than other currently used methods.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. In a wireless communication system, a method for estimating an original pilot signal, the method comprising:
   receiving a CDMA signal;
   despreading the CDMA signal;
   obtaining a pilot signal from the CDMA signal; and
   estimating the original pilot signal using a pilot estimator that includes a Kalman filter to produce a pilot estimate, wherein the Kalman filter is determined through use of a prediction error method based on an innovations representation of the original pilot signal, and wherein the Kalman filter is further configured to calculate the filtered estimate according to the following:

$$\hat{x}_k^+ = \hat{x}_k + \frac{\hat{L}}{\hat{a}} e_k$$

where: $\hat{x}_k^+$ is the filtered estimate;
$\hat{x}_k$ is a single-step predictor;
$e_k$ is the approximate innovations; and
$\hat{L}, \hat{a}$ are estimated parameters.

2. The method as in claim 1, wherein the CDMA signal is transmitted on a downlink and wherein the downlink comprises a pilot channel.

3. The method as in claim 1, wherein the CDMA signal is transmitted on an uplink and wherein the uplink comprises a pilot channel.

4. The method as in claim 1, further comprising demodulating the pilot estimate.

5. The method as in claim 1, wherein the Kalman filter is configured by an offline system identification process.

6. The method as in claim 5, wherein the Kalman filter is configured for improved group delay.

7. The method as in claim 5, wherein the offline system identification process comprises:
   providing training samples; and
   calculating parameters using the prediction error method and pseudo linear regression and generating a state estimate using the Kalman filter, wherein the calculating and generating are iteratively performed until the Kalman filter converges.

8. The method as in claim 7, wherein the parameters are calculated according to the following:

$$\hat{\theta} = \left( \sum_{k=1}^{N} \hat{\phi}_{k-1}^T \hat{\phi}_{k-1} \right)^{-1} \left( \sum_{k=1}^{N} \hat{\phi}_{k-1}^T y_k \right)$$

where: $\hat{\theta}$ represents the parameters;
$\hat{\phi}_{k-1}$ is a state estimate from the Kalman filter;
$\hat{\phi}_{k-1}^T$ is the transposed state estimate from the Kalman filter; and
$y_k$ is the received pilot signal.

9. The method as in claim 5, wherein the offline system identification process comprises:
providing training samples; and
calculating parameters using the prediction error method and a Gauss-Newton algorithm and generating a state estimate using the Kalman filter, wherein the calculating and generating are iteratively performed until the Kalman filter converges.

10. The method as in claim 9, wherein the parameters are calculated according to the following:

$$\Delta \hat{\theta} = \left( \sum_{k=1}^{N} \psi_{k-1}^T \psi_{k-1} \right)^{-1} \left( \sum_{k=1}^{N} \psi_{k-1}^T e_k \right)$$

where: $\Delta \hat{\theta}$ represents the parameters;
$\psi_{k-1}$ is a state estimate from the Kalman filter;
$\psi_{k-1}^T$ is the transposed state estimate from the Kalman filter; and
$e_k$ is the approximate innovations.

11. In a mobile station for use in a wireless communication system, a method for estimating an original pilot signal, the method comprising:
receiving a CDMA signal;
despreading the CDMA signal;
obtaining a pilot signal from the CDMA signal; and
estimating the original pilot signal using a pilot estimator that includes a Kalman filter to produce a pilot estimate, wherein the Kalman filter is determined through use of a prediction error method based on an innovations representation of the original pilot signal, and wherein the Kalman filter is further configured to calculate the filtered estimate according to the following:

$$\hat{x}_k^+ = \hat{x}_k + \frac{\hat{L}}{\hat{a}} e_k$$

where: $\hat{x}_k^+$ is the filtered estimate;
$\hat{x}_k$ is a single-step predictor;
$e_k$ is the approximate innovations; and
$\hat{L}, \hat{a}$ are estimated parameters.

12. The method as in claim 11, wherein the CDMA signal is transmitted on a downlink and wherein the downlink comprises a pilot channel.

13. The method as in claim 11, further comprising demodulating the pilot estimate.

14. The method as in claim 11, wherein the Kalman filter is configured by an offline system identification process.

15. The method as in claim 11, wherein the Kalman filter is configured for improved group delay.

16. The method as in claim 14, wherein the offline system identification process comprises:
providing training samples; and
calculating parameters using the prediction error method and pseudo linear regression and generating a state estimate using the Kalman filter, wherein the calculating and generating are iteratively performed until the Kalman filter converges.

17. The method as in claim 16, wherein the parameters are calculated according to the following:

$$\hat{\theta} = \left( \sum_{k=1}^{N} \hat{\phi}_{k-1}^T \hat{\phi}_{k-1} \right)^{-1} \left( \sum_{k=1}^{N} \hat{\phi}_{k-1}^T y_k \right)$$

where: $\hat{\theta}$ represents the parameters;
$\hat{\phi}_{k-1}$ is a state estimate from the Kalman filter;
$\hat{\phi}_{k-1}^T$ is the transposed state estimate from the Kalman filter; and
$y_k$ is the received pilot signal.

18. The method as in claim 14, wherein the offline system identification process comprises:
providing training samples; and
calculating parameters using the prediction error method and a Gauss-Newton algorithm and generating a state estimate using the Kalman filter, wherein the calculating and generating are iteratively performed until the Kalman filter converges.

19. The method as in claim 18, wherein the parameters are calculated according to the following:

$$\Delta \hat{\theta} = \left( \sum_{k=1}^{N} \psi_{k-1}^T \psi_{k-1} \right)^{-1} \left( \sum_{k=1}^{N} \psi_{k-1}^T e_k \right)$$

where: $\Delta \hat{\theta}$ represents the parameters;
$\psi_{k-1}$ is a state estimate from the Kalman filter;
$\psi_{k-1}^T$ is the transposed state estimate from the Kalman filter; and
$e_k$ is the approximate innovations.

20. A mobile station for use in a wireless communication system wherein the mobile station is configured to estimate an original pilot signal, the mobile station comprising:
an antenna for receiving a CDMA signal;
a receiver in electronic communication with the antenna;
a front-end processing and despreading component in electronic communication with the receiver for despreading the CDMA signal;
a pilot estimation component in electronic communication with the front-end processing and despreading component for estimating the original pilot signal using a pilot estimator that includes a Kalman filter to produce a pilot estimate, wherein the Kalman filter is determined through use of a prediction error method based on an innovations representation of the original pilot signal, and wherein the Kalman filter is further configured to calculate the filtered estimate according to the following:

$$\hat{x}_k^+ = \hat{x}_k + \frac{\hat{L}}{\hat{a}} e_k$$

where: $\hat{x}_k^+$ is the filtered estimate;
$\hat{x}_k$ is a single-step predictor;
$e_k$ is the approximate innovations; and
$\hat{L}, \hat{a}$ are estimated parameters; and
a demodulation component in electronic communication with the pilot estimation component and the front-end processing and despreading component for providing demodulated data symbols.

21. The mobile station as in claim 20, wherein the receiver receives the CDMA signal transmitted on a downlink and wherein the downlink comprises a pilot channel.

22. The mobile station as in claim 20, wherein the Kalman filter is configured by an offline system identification process.

23. The mobile station as in claim 22, wherein the Kalman filter is configured for improved group delay.

24. The mobile station as in claim 22, wherein the offline system identification process comprises:
providing training samples; and
calculating parameters using the prediction error method and pseudo linear regression and generating a state estimate using the Kalman filter, wherein the calculating and generating are iteratively performed until the Kalman filter converges.

25. The mobile station as in claim 24, wherein the parameters are calculated according to the following:

$$\hat{\theta} = \left(\sum_{k=1}^{N} \hat{\phi}_{k-1}^{T} \hat{\phi}_{k-1}\right)^{-1} \left(\sum_{k=1}^{N} \hat{\phi}_{k-1}^{T} y_k\right)$$

where: $\hat{\theta}$ represents the parameters;
$\hat{\phi}_{k-1}$ is a state estimate from the Kalman filter;
$\hat{\phi}_{k-1}^{T}$ is the transposed state estimate from the Kalman filter; and
$y_k$ is the received pilot signal.

26. The mobile station as in claim 22, wherein the offline system identification process comprises:
providing training samples; and
calculating parameters using the prediction error method and a Gauss-Newton algorithm and generating a state estimate using the Kalman filter, wherein the calculating and generating are iteratively performed until the Kalman filter converges.

27. The mobile station as in claim 26, wherein the parameters are calculated according to the following:

$$\Delta\hat{\theta} = \left(\sum_{k=1}^{N} \psi_{k-1}^{T} \psi_{k-1}\right)^{-1} \left(\sum_{k=1}^{N} \psi_{k-1}^{T} e_k\right)$$

where: $\Delta\hat{\theta}$ represents the parameters;
$\psi_{k-1}$ is a state estimate from the Kalman filter;
$\psi_{k-1}^{T}$ is the transposed state estimate from the Kalman filter; and
$e_k$ is the approximate innovations.

* * * * *